United States Patent [19]
Peterson et al.

[11] Patent Number: 5,923,101
[45] Date of Patent: Jul. 13, 1999

[54] NON-CONTACT KEY

[75] Inventors: Gregory A. Peterson, South Barrington; James W. Ensinger, Palatine, both of Ill.

[73] Assignee: Emerson Electric Company, St. Louis, Mo.

[21] Appl. No.: 08/825,869

[22] Filed: Apr. 2, 1997

Related U.S. Application Data

[51] Int. Cl.$^6$ .......................................... G01V 3/08
[52] U.S. Cl. .......................... 307/104; 307/116; 257/428; 340/551; 340/552; 361/179
[58] Field of Search ...................... 307/104, 112, 307/116, 117, 125, 126, 139, 149; 340/541, 551, 552, 561, 565, 567, 933, 20, 22; 250/559.12, 208.4, 214 SW, 573, 221, 222.1; 324/200; 342/27; 361/179

[56] References Cited

U.S. PATENT DOCUMENTS

| | | | |
|---|---|---|---|
| 2,649,538 | 8/1953 | Marlowe et al. | 342/27 |
| 3,602,806 | 8/1971 | Czekajewski | 324/200 |
| 4,346,376 | 8/1982 | Mallos | 250/541 |
| 4,692,739 | 9/1987 | Dorn | 250/221 |
| 4,939,358 | 7/1990 | Herman et al. | 250/221 |
| 5,243,183 | 9/1993 | Barron, Jr. et al. | 250/222.1 |
| 5,367,158 | 11/1994 | Herman et al. | 250/221 |
| 5,554,972 | 9/1996 | Byrne | 250/221 |
| 5,563,580 | 10/1996 | Stephens | 340/541 |
| 5,594,222 | 1/1997 | Caldwell | 200/600 |
| 5,652,577 | 7/1997 | Fraiser | 340/933 |
| 5,673,041 | 9/1997 | Chatigny et al. | 341/22 |
| 5,703,566 | 12/1997 | Weaver | 340/551 |

FOREIGN PATENT DOCUMENTS 0688 02A1  12/1995  European Pat. Off. .

OTHER PUBLICATIONS

International Search Report.

*Primary Examiner*—Albert W. Paladini
*Attorney, Agent, or Firm*—Arnold, White & Durkee

[57] ABSTRACT

A non-contact switch movs from an off position to an on position when a lossy material enters a sensitive area of the switch. The non-contact switch comprises a transmitting element and a sensing element. The transmitting element is capable of radiating a signal. A portion of the signal passes through the sensitive area of the switch. The sensing element is capable of receiving the signal. When the received signal is less than a predetermined level, the received signal represents the lossy material entering the sensitive area of the switch.

28 Claims, 11 Drawing Sheets

Microfiche Appendix Included
(1 Microfiche, 20 Pages)

NON-CONTACT KEY

MICROFICHE APPENDIX

A microfiche appendix contains 1 microfiche and 20 frames.

BACKGROUND OF THE INVENTION

1. Field of the Invention

The present invention relates generally to a switch or key on a keypad and, more particularly, to a non-contact switch or key.

2. Description of the Related Art

Keypads or keyboards provide operator interface with household appliances and electronic devices, as well as industrial devices. Keypads may contain one or more switches or keys to allow an operator to enter instructions or information to the household or industrial device. The instructions or information entered may be a simple ON/OFF instruction or a complex combination of alphabetical and numerical information.

A typical switch is a manually or mechanically actuated device for making, breaking or changing the connections in an electrical circuit. A keypad or keyboard has a set of switches or keys arranged systematically and used to operate a piece of equipment. The typical keyboard is a raised keyboard similar to the type used on personal computers. The individual keys or switches are raised above the base of the keyboard. To activate the keys, an operator applies a force to manually depress the key into contact with the base of the keyboard. The main problem with this keyboard is that a force must be directly applied to the individual keys to activate them. Another problem with raised keyboards is that they are difficult to clean and dirt and foreign materials can accumulate in the gaps between the keys. Furthermore, any liquid spilled onto the keyboard seeps into the gaps causing corrosion or keyboard failure. These problems are compounded when this type of keyboard is placed in an environment such as a kitchen where foods and liquids will contact the keyboard.

Flat keyboards have been developed to prevent foreign materials from gathering and seeping between the individual keys. The typical flat keyboard is a membrane keyboard. The membrane keyboard provides a continuous flat layer of plastic material. Individual membrane switches correspond to the individual keys. A membrane switch has a flexible top layer separated from a bottom layer. To activate the switch on the membrane keyboard, a force must be applied to depress the top layer into contact with the bottom layer. The main problem with the membrane keyboard is that a force must be applied to depress the membrane keys. An additional problem with the membrane keyboard is that it is susceptible to damage. The top plastic layer tends to easily scratch or puncture. Additionally, typical cleaning solvents may damage the plastic layer.

Glass keyboards have been developed to provide non-contact key activation. The typical glass keyboard generally senses the proximity of a human finger to a key by measuring the entire human body's capacitance to earth ground. When a human finger comes within a predetermined proximity to a key, the key is activated. These glass keyboards provide the desired non-contact feature, but they have performance drawbacks. The capacitance technique has proven to be unreliable at installations where a good earth ground does not exist. Additionally, electrically noisy environments interfere with the performance of the key. Furthermore, performance is usually compromised by a wide range of behavior from one keyboard to another. Performance is further compromised by large variations in temperature. Not only is the performance of the capacitance glass keyboards lacking, but some systems require expensive and difficult manufacturing methods, such as vapor deposition of conductive regions or placement of components onto glass.

Thus, a need has arisen for new key or keypad which will activate without the application of a force, will prevent foreign materials from gathering between the individual keys, will clean easily, will offer damage protection, and will provide consistent performance.

SUMMARY OF THE INVENTION

In accordance with one aspect of the present invention, there is provided a non-contact switch or key for changing from an off position to an on position when a lossy material, such as a human finger, enters a sensitive area of the switch. The non-contact switch comprises an oscillator which provides a signal to a transmitting element. The transmitting element radiates a portion of the signal as electromagnetic energy. Part of this electromagnetic energy is directed into the sensitive area above the switch. A sensing element electromagnetically coupled to the transmitting element produces a signal representing the amount of energy coupled from the electromagnetic field. When the finger moves into the switch's sensitive area, the finger absorbs some of the electromagnetic energy in the sensitive area of the switch. The absorption of electromagnetic energy by the finger reduces the magnitude of the signal in the sensing element. A sensing circuit analyzes the sensing element's signal, detecting when the signal falls below a predetermined level which represents the presence of a finger. Upon detection of the finger, the sensing circuitry activates the switch from the off position to the on position.

Another aspect of the invention is a keypad comprising an oscillator supplying a signal, a sensing circuit and one or more keys. Each key on the keypad has a transmitting element radiating a portion of a signal as electromagnetic energy. Part of the electromagnetic energy is directed into the sensitive area above the key. Each key also has a sensing element electromagnetically coupled to the transmitting element producing a signal representing the amount of energy coupled from the electromagnetic field. When the finger moves into the key's sensitive area, the finger absorbs some of the electromagnetic energy in the sensitive area. The absorption of electromagnetic energy by the finger reduces the magnitude of the signal in the sensing element. A sensing circuit analyzes each key's sensing element's signal, detecting when one of the signals falls below a predetermined level which represents the presence of a finger. Upon detection of the finger, the sensing circuit actuates that key.

BRIEF DESCRIPTION OF THE DRAWINGS

The foregoing and other advantages of the invention will become apparent upon reading the following detailed description and upon reference to the drawings which:

FIG. 3b is a top view of the preferred embodiment for the transmitting and sensing elements for the non-contact key of FIG. 3a;

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the appended claims.

DETAILED DESCRIPTION OF THE INVENTION

Figure 1A:
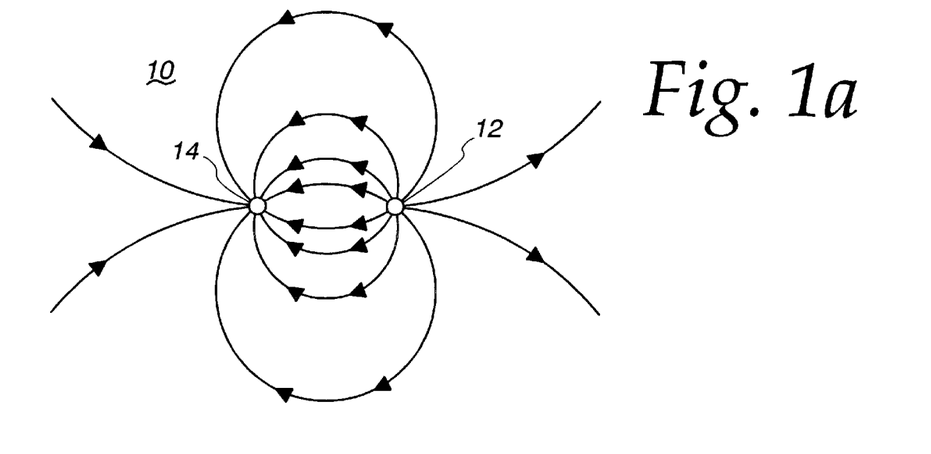
FIG. 1a is an edge view of the electromagnetic field between a transmitting element and a sensing element.

Turning now to the drawings, FIG. 1a illustrates a simplified embodiment of a non-contact key 10 according to the present invention. When a transmitting element 12 is supplied with a signal, the transmitting element 12 radiates a portion of that signal to a sensing element 14. The arrowed lines in FIG. 1a represent the electromagnetic field or flux lines between the transmitting element 12 and sensing element 14. Electromagnetic coupling between the transmitting element 12 and sensing element 14 produces a signal within the sensing element 14 representing the amount of energy received by the sensing element 14.

Figure 1B:
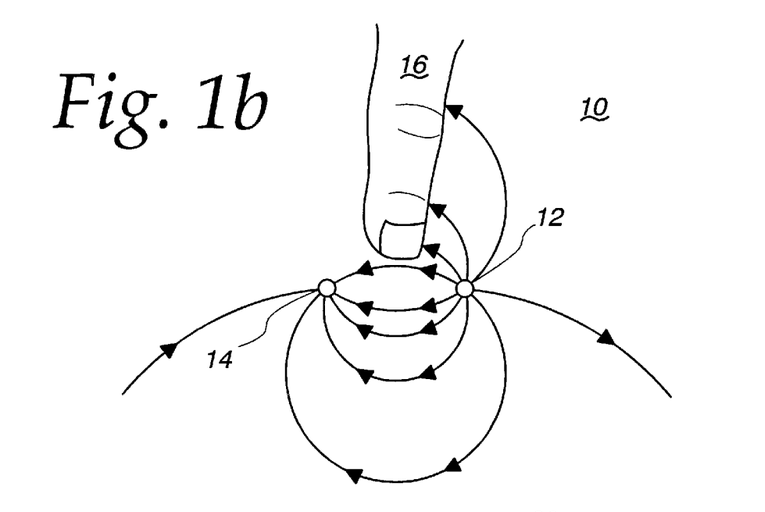
FIG. 1b is an edge view of the electromagnetic field between a transmitting element and a sensing element being interrupted by a human finger.

A lossy material, such as a human finger 16, dissipates the energy of an electromagnetic field that passes through the lossy material. As illustrated in FIG. 1b, when a finger 16 enters the electromagnetic field radiated between the transmitting and sensing elements 12 and 14, the finger 16 absorbs energy from the electromagnetic field. The finger's close proximity to the non-contact key 10 and absorption of the electromagnetic energy results in a reduction in the signal within the sensing element 14. The non-contact key interprets this reduction in signal to represent a key press and actuates the switch or key as described in detail below.

Figure 2:
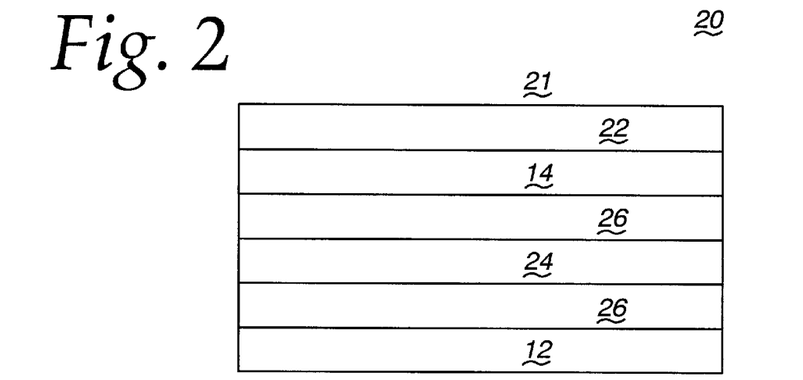
FIG. 2 is an edge view of one embodiment of a non-contact key.

FIG. 2 illustrates an edge view of one embodiment of the non-contact key 20. The non-contact key 20 has multiple layers positioned beneath a top layer 22. The multiple layers may be attached to the top layer 22 in any suitable manner or mounted behind the top layer 22 in any suitable manner. The multiple layers comprise a ground plane 24 and two spacer layers 26 separating the transmitting element 12 from the sensing element 14.

The layers of the non-contact key 20 are designed and arranged to concentrate a significant amount of the electromagnetic energy passing between the transmitting element 12 and the sensing element 14 within a sensitive area 21 of the non-contact key 20. The sensitive area 21 of the non-contact key 20 is an area extending a short distance directly above the top layer 22. The sensitive area 21 is the area where an operator would place his or her finger to actuate the non-contact key 20.

To concentrate electromagnetic energy in the sensitive area 21, electromagnetic energy must pass from the transmitting element 12 through the top layer 22 out into the sensitive area 21 before being received by the sensing element 14. The electromagnetic field between the elements 12 and 14 comprises direct flux and fringing flux. To concentrate electromagnetic energy in the sensitive area 21, a significant percentage of electromagnetic field must be fringing flux passing through the sensitive area 21 before being received by the sensing element 14. By concentrating the electromagnetic field in the sensitive area 21, a lossy material, such as a human finger, entering the sensitive area 21 absorbs a noticeable portion of the electromagnetic energy passing to the sensing element 14. Because the human finger absorbs a noticeable amount of the electromagnetic energy received by the sensing element 14, the signal produced in the sensing element 14 is significantly less than when the finger is not present. This significant drop in the sensing element signal represents a key press.

The transmitting element 12 and the sensing element 14 control the concentration of electromagnetic field in the sensitive area 21 of the non-contact key 20. The transmitting and sensing elements 12 and 14 are conductors made of any suitable conductor such as copper, silver, gold. A typical element 12 or 14 may consist of a copper track layered on a printed circuit board. If silk screening manufacturing techniques are used for the conductors 12 and 14, coating the elements 12 and 14 with a conductive ink, such as a silver carbon composite conductive ink, lowers the resistance of the elements 12 and 14 and facilitates transmission and reception of the signal.

Figure 3A:
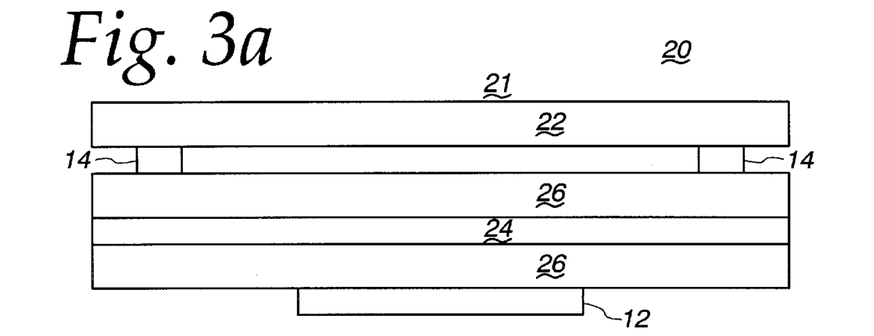
FIG. 3a is an edge view of the preferred embodiment of a non-contact key.
Figure 3B:
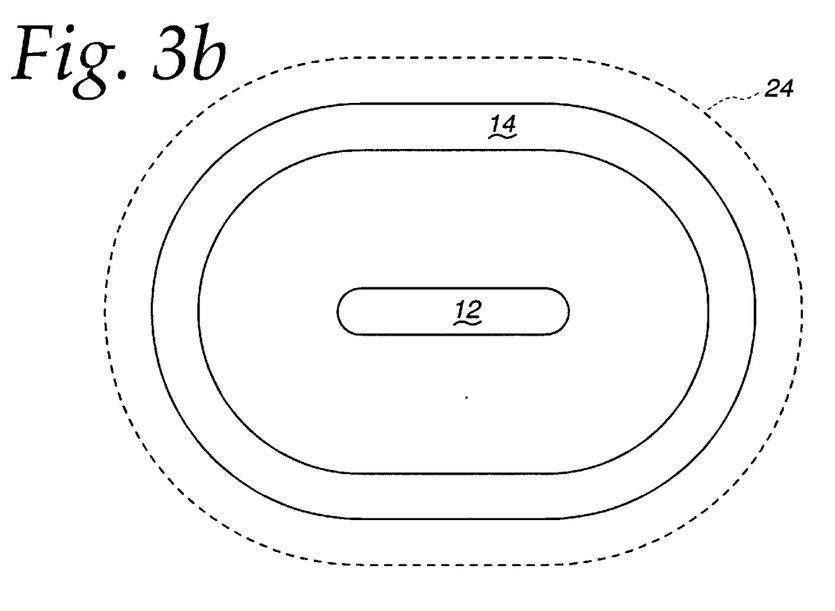

FIGS. 3a and 3b illustrate the preferred embodiment of the non-contact key 20 with specific materials and dimensions. FIG. 3a illustrates an edge view of this embodiment. The top layer 22 comprises 0.125 inch thick glass. The sensing unit 14 is 1 mil thick copper layered on a 0.025 inch thick plastic printed circuit board as the spacer 26. The ground plane 24 is 1 mil thick copper layered on a 0.020 inch thick plastic printed circuit board as spacer 26. Finally, a 1 mil thick copper transmitting element 12 is layered on the underside of the printed circuit board 26.

The shapes of the transmitting element 12 and the sensing element 14 affect the amount of electromagnetic energy in the sensitive area 21 of the non-contact key 20. The shapes of the elements 12 and 14 are designed to facilitate the passing of electromagnetic energy from the transmitting element 12 into the sensitive area 21 and back to the sensing element 14.

FIG. 3b illustrates a top view of the preferred embodiment for the non-contact key 20 in FIG. 3a. The ovular sensing element 14 encircles the disk shaped transmitting element 12. The transmitting element comprises two identical semicircular ends with 0.025 inch radii connected by a rectangular track with 0.200 inch length and 0.050 width. The sensing element 14 comprises two identical semicircular tracks with an inner radius of 0.175 inch and width of 0.050 inch. Connecting the semicircular tracks are two rectangular tracks of length 0.200 inch and width of 0.050 inch. The opening of the ground plane 24 comprises two identical semicircular ends with 0.200 inch radii connected by a square area of 0.200 inch length and 0.200 inch width. When this preferred embodiment was tested, a signal of four megahertz was supplied to the transmitting element 12. The presence of a finger in the sensitive area 21, just barely touching the top layer 22, resulted in a greater than twenty percent reduction in the sensing element's signal than without the finger in the sensitive area 21.

Figure 4A:
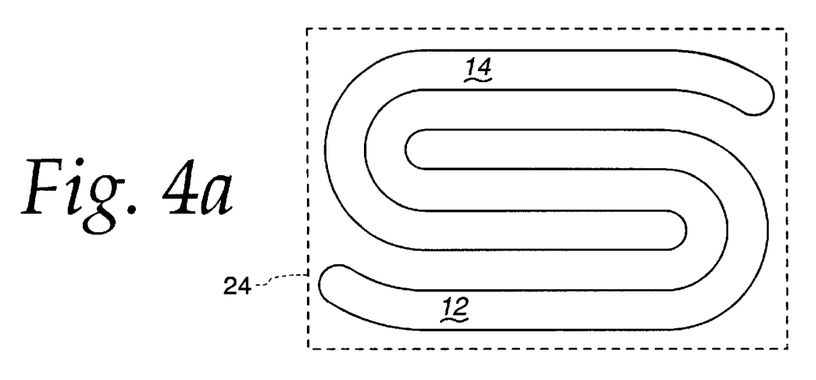
FIG. 4a is a top view of another embodiment for the transmitting and sensing elements for the non-contact key.
Figure 4B:
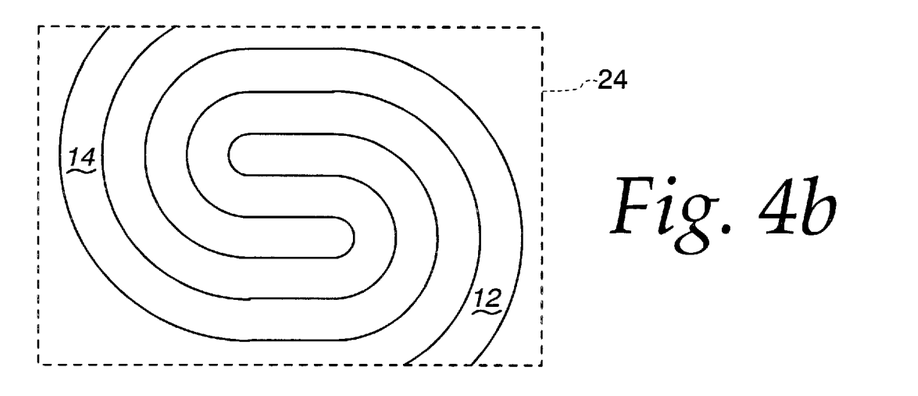
FIG. 4b is a top view of another embodiment for the transmitting and sensing elements for the non-contact key.
Figure 4C:
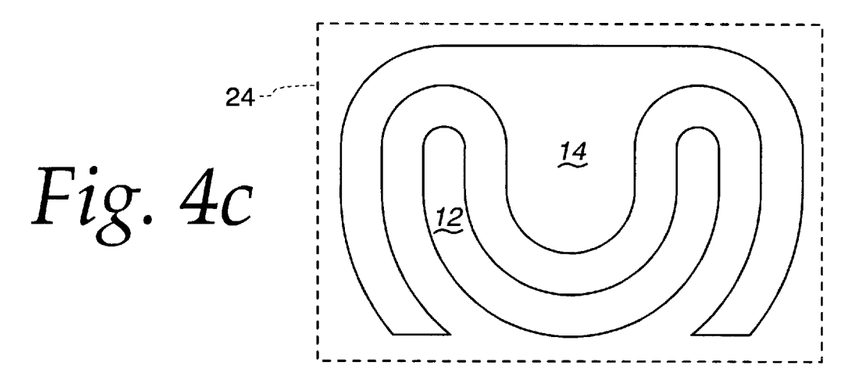
FIG. 4c is a top view of another embodiment for the transmitting and sensing elements for the non-contact key.
Figure 4D:
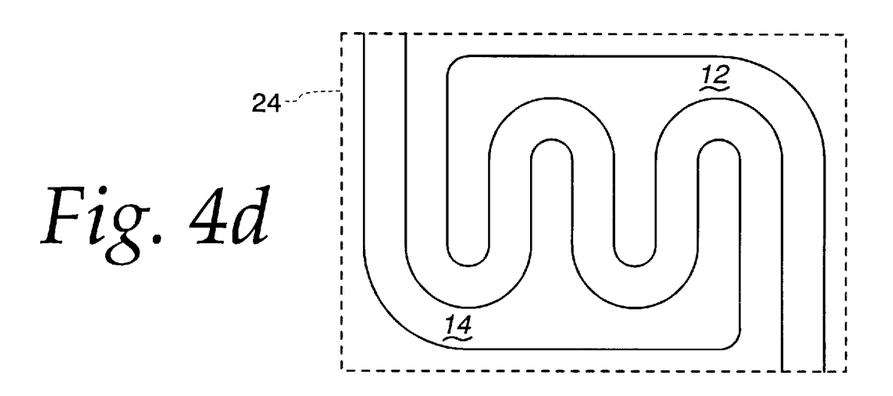
FIG. 4d is a top view of another embodiment for the transmitting and sensing elements for the non-contact key.
Figure 4E:
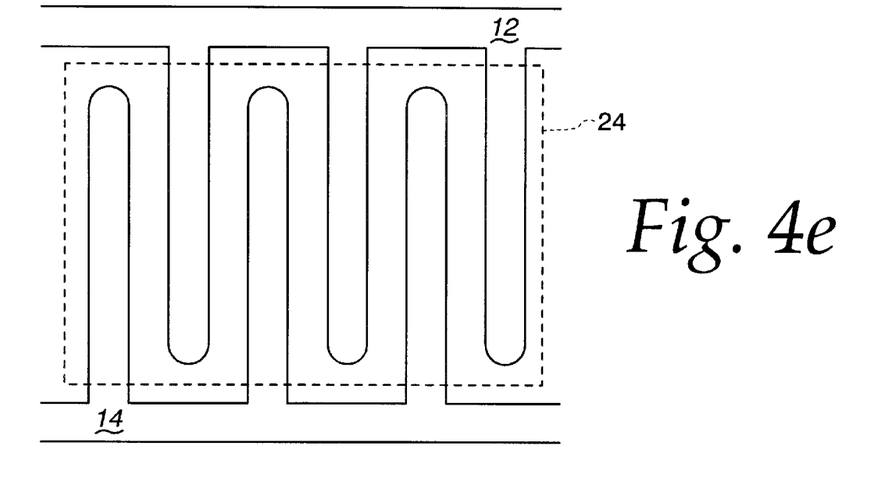
FIG. 4e is a top view of another embodiment for the transmitting and sensing elements for the non-contact key.
Figure 4F:
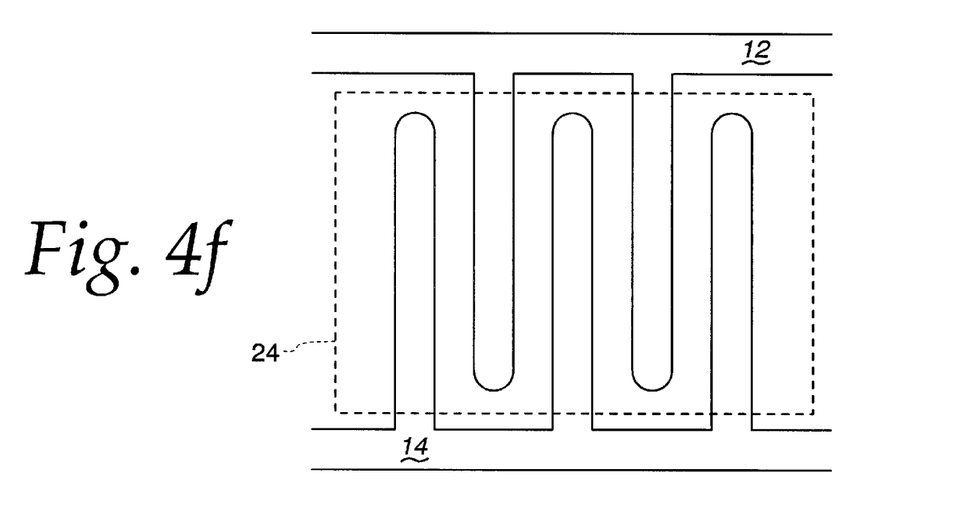
FIG. 4f is a top view of another embodiment for the transmitting and sensing elements for the non-contact key.
Figure 4G:
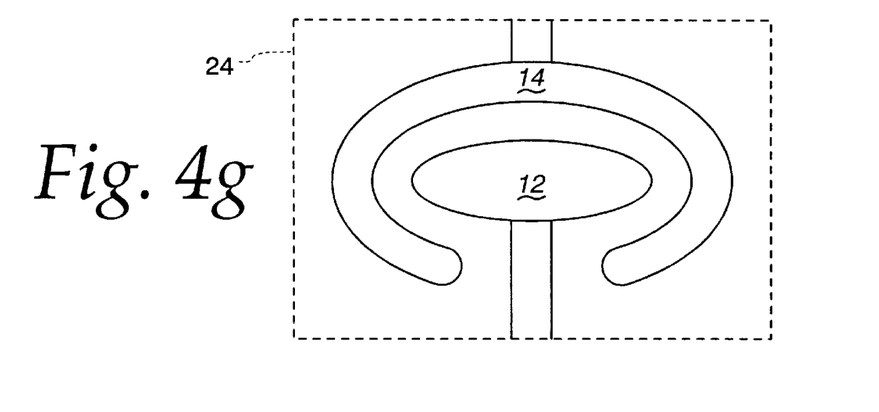
FIG. 4g is a top view of another embodiment for the transmitting and sensing elements for the non-contact key.

There are many possible embodiments for the shape of the transmitting and sensing elements 12 and 14. FIGS. 4a through 4g are top views of the non-contact key 20 illustrating some of those embodiments. FIG. 4a illustrates one embodiment for the arrangement of the transmitting and sensing elements 12 and 14. The interlocking and wrapping around U-shaped elements 12 and 14 concentrate electromagnetic energy in the sensitive area 21 of the key 20. The embodiment in FIG. 4b illustrates the elements 12 and 14 as interlocking swirls wrapped around each other. The embodiment of FIG. 4c illustrates a U-shaped transmitting element 12 interlocking a curved W-shaped sensing element 14. Another embodiment for FIG. 4c would be a U-shaped sensing element interlocking a curved W-shaped transmitting element. In FIG. 4d interlocked W-shaped transmitting and sensing element 12 and 14 provide the concentration of electromagnetic energy in the sensitive area 21. Similarly, three legs of the transmitting element 12 interlock between three legs of the sensing element 14 in FIG. 4e and in FIG. 4f two legs of the transmitting element 12 interlock between three legs of the sensing element 14. Additionally, the electromagnetic energy may be concentrated in the sensitive area 21 by the C-shaped sensing element surrounding the oval 12 as illustrated by FIG. 4g. Another embodiment for FIG. 4g would be a C-shaped transmitting element surrounding the oval sensing element. The above examples of shaping for the transmitting and sensing elements 12 and 14 are not intended to limit the invention to those specific shapes. One of ordinary skill in the art would know variations in the shapes of the elements 12 and 14 to obtain the desired concentration of electromagnetic energy within the sensitive area 21 of the non-contact key 20.

The horizontal spacing between the elements 12 and 14 further affects the amount of the electromagnetic energy in the sensitive area 21 of the non-contact key 20. Generally for the non-contact key 20, when the horizontal distance between the transmitting element 12 and the sensing element 14 increases, the amount of direct flux between the elements 12 and 14 decreases at a faster rate than the decrease in the amount of fringing flux. By increasing the horizontal spacing between the elements 12 and 14, a higher percentage of electromagnetic energy is fringing flux concentrated in the sensitive area 21. The precise relationship between the amount of electromagnetic energy in the sensitive area 21 and the horizontal distance between the elements 12 and 14 can be determined by one skilled in the art generating the appropriate field equations. The horizontal spacing for the preferred embodiment in FIGS. 3a and 3b has been disclosed above, however the horizontal spacing is not intended to be limited to that dimension. One of ordinary skill in the art would know variations in the horizontal spacing that would obtain the desired concentration of electromagnetic energy within the sensitive area 21 of the non-contact key 20.

The vertical spacing between the elements 12 and 14 also effects the concentration of the electromagnetic energy in the sensitive area 21 of the non-contact key 20. Generally for the non-contact key 20 with transmitting element 12 and sensing element 14 separated by a small distance similar to that of the preferred embodiment in FIG. 3b, when the vertical distance between the transmitting element 12 and the sensing element 14 increases, the percentage of direct flux increases and the percentage of fringing flux decreases until the elements are so far apart the relationship fails. The exact relationship between the amount of the electromagnetic energy in the sensitive area 21 and the vertical distance between the elements 12 and 14 can be determined by one skilled in the art generating the appropriate field equations. The spacers 26 provide the necessary vertical spacing between the transmitting element 12 and the sensing element 14. These spacers 26 are composed of any insulting material such as flexible plastic or mylar. One skilled in the art knows that the dielectric constant of the spacer material effects the electromagnetic energy passing through the spacers 26. The vertical spacing and spacer material for the preferred embodiment in FIGS. 3a and 3b have been disclosed above, however the spacer material and vertical spacing are not intended to be limited to that material and dimension. One of ordinary skill in the art would know variations in the vertical spacing and spacer material that would obtain the desired electromagnetic energy within the sensitive area 21 of the non-contact key 20.

The thickness of the top layer 22 and the type of material of the top layer 22 affect the amount of electromagnetic energy passing through the sensitive area 21 of the non-contact key 20. The top layer 22 must be strong enough to protect the key from damage. The preferred material for the top layer 22 is glass; however, other insulating materials such as drywall and wood may also be used. Generally, when the dielectric constant of the material decreases, the amount of electromagnetic energy passing through the top layer into the sensitive area 21 decreases. Generally, when the thickness of the top layer 22 increases, the amount of electromagnetic energy in the sensitive area 21 decreases. The exact relationship between the strength of the electromagnetic field in the sensitive area 21 and the thickness of the top layer 22 can be determined by one skilled in the art generating the appropriate field equations. The material and thickness of the top layer for the preferred embodiment in FIGS. 3a and 3b have been disclosed above, however the material and thickness of the top layer are not intended to be limited to that material and dimension. One of ordinary skill in the art would know variations in the material and thickness of the top layer that would obtain the desired electromagnetic energy within the sensitive area 21 of the non-contact key 20.

To provide the desired concentration of electromagnetic energy within the sensitive area 21 of the non-contact key 20, the thickness and type of material for the top layer 22, and the shape, horizontal spacing and vertical spacing of the transmitting and sensing elements 12 and 14 must be designed together. All of the above described factors must be considered in conjunction with each other to provide the desired concentration of electromagnetic energy in the sensitive area 21. The above collection of factors for the preferred embodiment in FIG. 3b have been disclosed above, however the invention is not intended to be limited to specific materials, structure or dimensions. One of ordinary skill in the art would know variations in the above factors that would obtain the desired electromagnetic energy within the sensitive area 21 of the non-contact key 20.

Returning to FIG. 2 and FIG. 3a, the ground plane 24 coordinates the concentration of electromagnetic energy in the sensitive area 21. The ground plane 24 is a conductive sheet, such as copper or aluminum, with an opening corresponding to the outline of the sensitive area 21 of non-contact key 20. The ground plane 24 provides a window for the electromagnetic energy to pass from the transmitter element 12 to the sensing element 14. FIGS. 4a through 4g illustrate the window provided by the ground plane 24. Any electromagnetic energy that does not pass through the window terminates on the ground plane 24 before reaching the sensing element 14. The ground plane 24 localizes the electromagnetic field to the sensitive area 21 which reduces the interaction of one key with its neighbors if multiple non-contact keys 20 are arranged in a matrix as described below.

Figure 5:
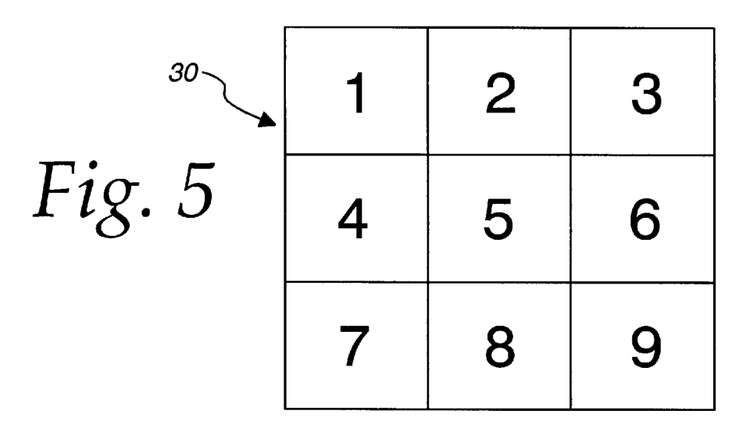
FIG. 5 is a top view of one embodiment of a keypad.

The non-contact key 20 may be used on a household appliance or industrial device alone or in a matrix to provide a keypad 30. FIG. 5 illustrates a typical keypad 30 to provide operator interface with a device. For the keypad 30 composed of non-contact keys 20, the glass top 22 and spacers 26 would be continuous sheets of their corresponding materials. Additionally, the ground plane 24 would be a continuous sheet with openings corresponding to the outline of the sensitive area of each key. For each of the keys, one transmitting element provides an electromagnetic field which produces a signal within its corresponding sensing element. When a finger comes into the sensitive area, the finger absorbs electromagnetic energy causing a reduction in the signal produced within the key's sensing element representing a key press. By monitoring the signal from all of the sensing elements, a key press can be detected on a keypad.

Figure 6A:
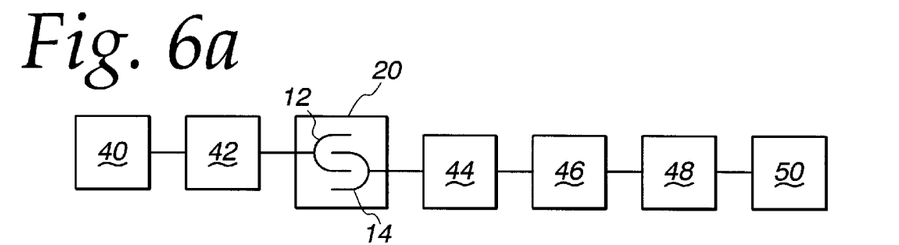
FIG. 6a is a block diagram of the operation of the non-contact key.

FIG. 6a illustrates a block diagram of the operation of a single non-contact key 20. An oscillator 40 provides a signal to an impedance matching network 42. The preferred frequency level for the signal supplied by the oscillator is four megahertz. A four megahertz frequency allows inexpensive electronic components to be used for the oscillator and in the non-contact key's sensing circuit 50. The impedance matching network 42 matches the impedance of the transmitting side with the impedance of the sensing side to send the signal at the proper level. Any form of impedance matching network known to one of ordinary skill in the art can be used. From the impedance matching network 42, the signal is sent to the transmitting element 12. The transmitting element 12 radiates a portion of the signal as electromagnetic energy into the surrounding space. The signal is electromagnetically coupled to the sensing element 14 producing a sensing element signal. The sensing element signal is passed through another impedance matching network 44. The impedance matching network 44 matches the impedance of the sensing side with the impedance of the transmitting side to receive the signal at the proper level. Any form of impedance matching network known to one of ordinary skill in the art can be used. To eliminate any noise that the sensing element may have picked up, a band pass filter 46 filters the sensing element signal. The band pass filter 46 passes a resonant frequency matching the transmitting frequency such as four megahertz. Any form of band pass filter known to one of ordinary skill in the art can be used. The filtered signal then is amplified by a variable gain amplifier 48 before being sent to a sensing circuit 50. Any form of variable gain amplifier known to one of ordinary skill in the art can be used. The sensing circuit 50 monitors the level of the signal from the amplifier. When the signal drops from its running average below a predetermined level representing a key press, the sensing circuit 50 may make, break or change the connections of an electrical circuit depending on the application for the key. For the preferred embodiment disclosed above, a ten percent drop from running average represents a key press. The preferred embodiment for the sensing circuit 50 is a microprocessor such as the Hitachi HD404314. The sensing circuit 50 can also be a comparator as known to one of ordinary skill in the art. Once the finger has been removed from the sensitive area and the key's connection have been made, the process restarts with the signal level returning to its running average and the sensing circuit 50 monitoring the signal level.

Figure 6B:
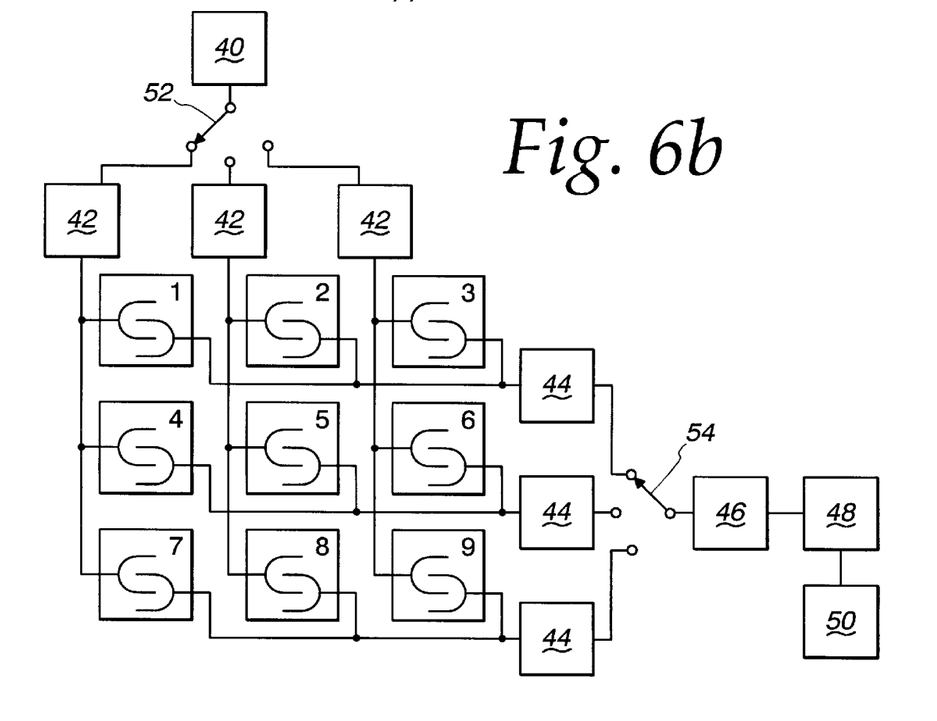
FIG. 6b is a block diagram of the operation of a matrix of non-contact keys.

When several non-contact keys 20 are arranged in a matrix like the keypad 30 of FIG. 5, the basic components and operation of the keypad are the similar to the operation and components of the single non-contact key 20. FIG. 6b illustrates a block diagram for a matrix of non-contact keys. The switch matrix in FIG. 6b has the individual non-contact keys arranged in rows and columns. In this embodiment, transmitting elements for the keys in the same column are connected together, and the sensing elements for the keys in the same row are connected together. A single oscillator 40 provides the signal to all of the transmitting elements one column at a time by means of a switch 52. A sensing circuit 50 electrically controls the switch 52 to switch between the columns of the matrix. As shown in FIG. 6b, each column has an impedance matching network 42 and three connected transmitting elements. When supplied with the signal, each transmitting element 12 transmits a portion of the signal, and its corresponding sensing element generates a signal. Each row has three connected sensing elements and a impedance matching network 44. A switch 54 provides the signal generated within a sensing element to the band pass filter 46, the variable gain amplifier 48 and into the sensing circuit 50. The switch 54 is electrically controlled by the sensing circuit 50 to switch between rows corresponding to the switch 52 switching between columns. By the operation of the switches the sensing circuit 50 samples the signal generated in each key's sensing element in a sequential order.

The sensing circuit 50 for the non-contact key and matrix of keys monitors the signal received from the amplifier 48. When the level of signal drops below a minimum level representing a key press, the switch or key is activated. The sensing circuit 50 may be a simple comparator circuit or a microprocessor. The sensing circuit may be designed to automatically compensate for variations due to environment as illustrated by the microprocessor program described in detail below.

Figure 7:
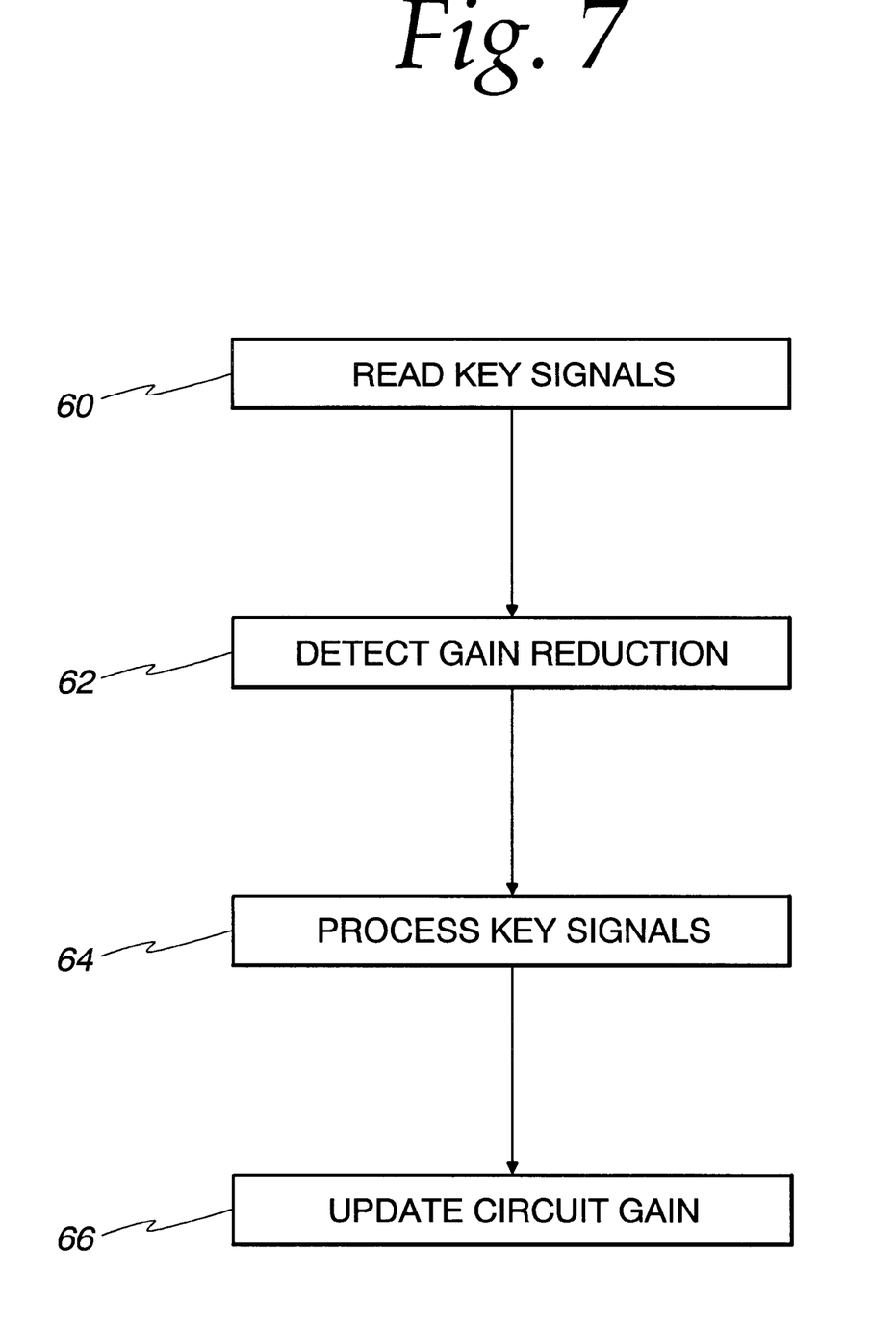
FIG. 7 is a flow chart of the microprocessor operations for one embodiment of a keyboard scan program.

In the preferred embodiment, the sensing circuit 50 is a microprocessor performing a keyboard scan program to detect key presses on a keypad. FIG. 7 illustrates the various functional blocks of the keyboard scan processing operations of the microprocessor to detect a key press. At the top level, the microprocessor begins by executing a read key signals program 60. The read key signals functional block reads and stores the peak to peak signal values from each key. At the next level, the microprocessor executes a detect gain reduction program 62. The detect gain reduction functional block is optional and determines the number of keys that have dropped below a noise level to provide feedback for the update circuit gain functional block. In the next functional block, the process key signals functional block 64, the microprocessor determines if the present key signal is a key press or if the signal should be filtered into the key's running average value. At the final level, the microprocessor executes an update circuit gain functional block 66 to update and adjust the circuit gain to automatically compensate for environmental variations. After completing the above functional blocks, the microprocessor restarts at the top level 60.

Figure 8:
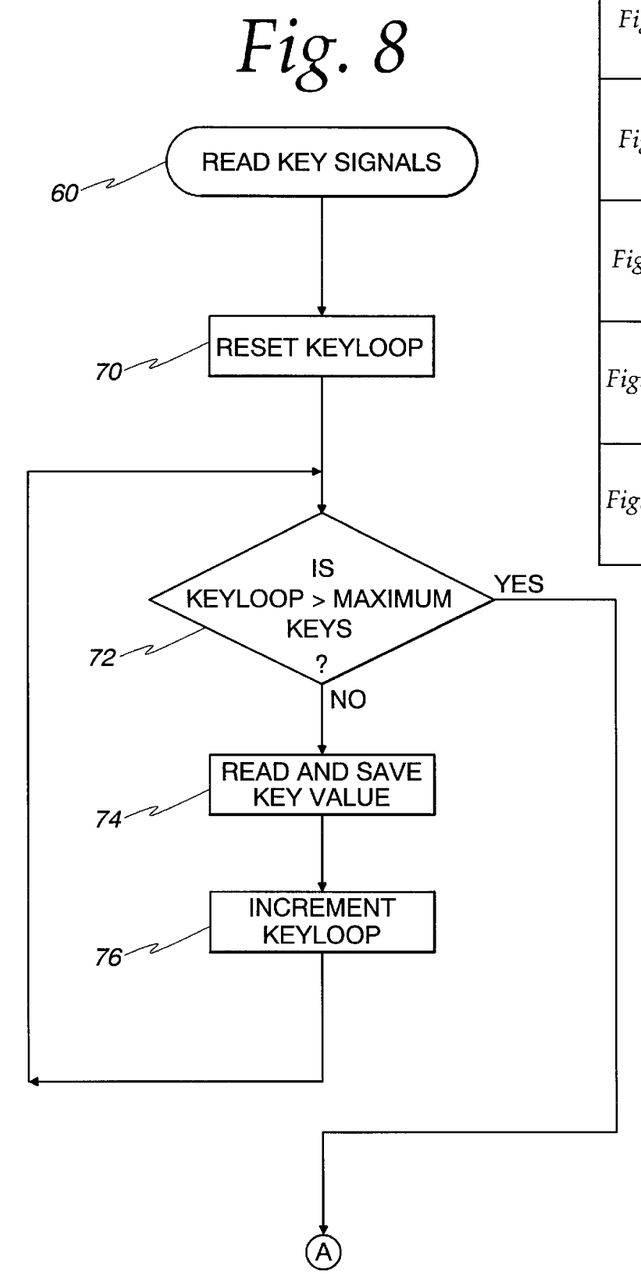
FIG. 8 is a flow chart of one embodiment of the read key signals functional block of the program of FIG. 7.

FIG. 8 illustrates the read key signals functional block 60. The program begins by resetting a short-term variable used to index the keyboard matrix called KEYLOOP at step 70. At step 72, the microprocessor determines whether the KEYLOOP counter is greater than the number of keys on the keypad. If the answer at step 72 is affirmative, then the microprocessor continues onto the detect gain reduction functional block 62. If the answer at step 72 is negative, the microprocessor reads and stores the key's peak to peak signal in memory at step 74. At step 76, the KEYLOOP counter is incremented and control is returned to step 72.

Figure 9:
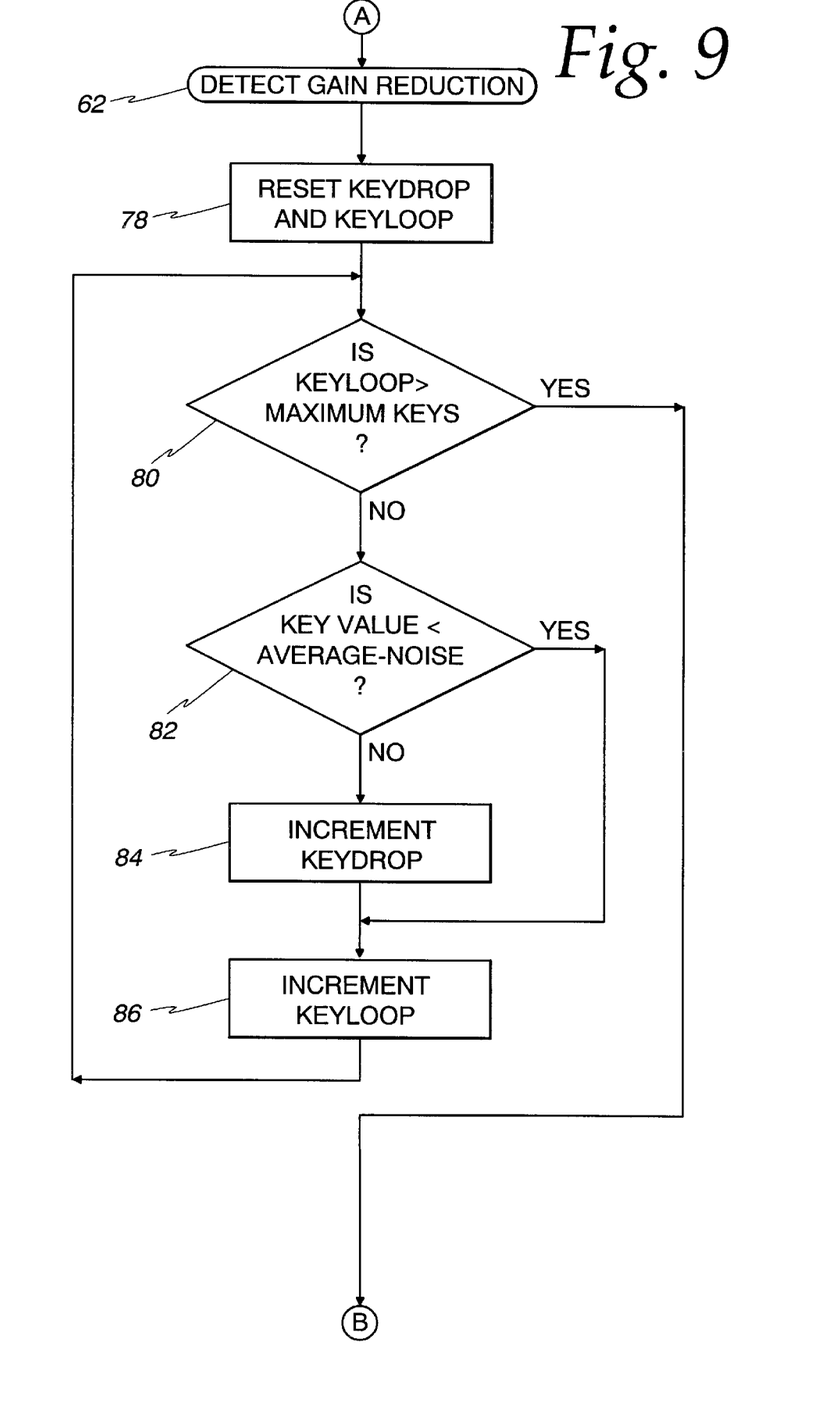
FIG. 9 is a flow chart of one embodiment of the detect gain reduction functional block of the program of FIG. 7.

FIG. 9 illustrates the detect gain reduction functional block 62. The program begins by resetting the KEYLOOP variable and by resetting a short-term variable used to hold the keys dropped count called KEYDROP at step 78. At step 80, the microprocessor determines whether the KEYLOOP counter is greater than the number of keys on the keyboard. If the answer at step 80 is affirmative, then the microprocessor continues onto the process key signals functional block 64. If the answer at step 80 is negative, the microprocessor determines whether the keys peak to peak value is less than its running average by more than a noise level at step 82. If step 82 is affirmative, the KEYDROP variable is incremented at step 84 and control is sent to step 86. If step 82 is negative, control is sent to step 86. At step 86, the KEYLOOP counter is incremented and control is returned to step 80.

Figure 10:
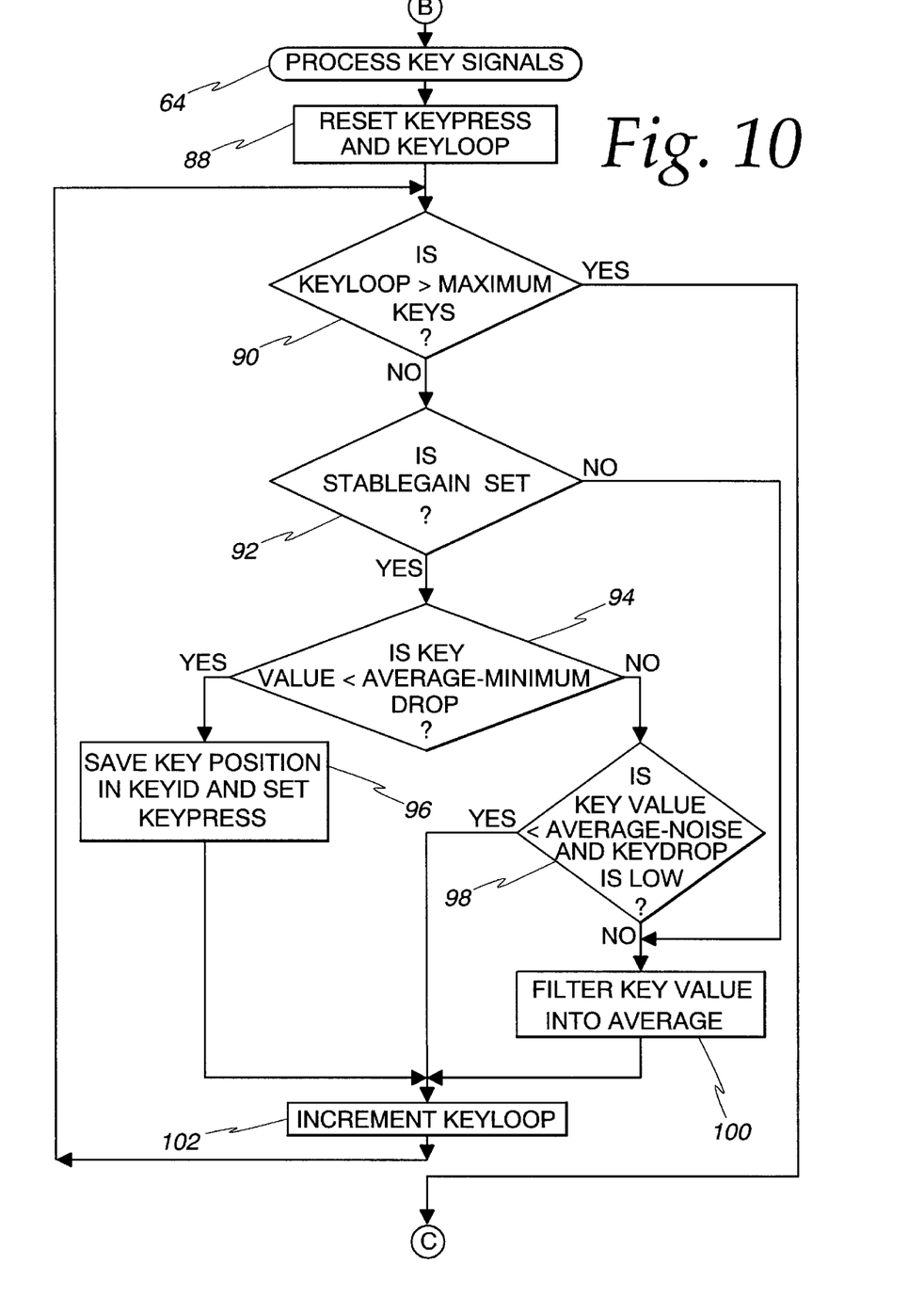
FIG. 10 is a flow chart of one embodiment of the process key signals functional block of the program of FIG. 7.

FIG. 10 illustrates the process key signals functional block 64. The program begins at step 88 by resetting the variable KEYLOOP and resetting a KEYPRESS flag representing a the detection of a key press. At step 90, the microprocessor determines whether the KEYLOOP counter is greater than the number of keys on the keyboard. If the answer at step 90 is affirmative, then the microprocessor continues onto the update circuit gain functional block 66. If the answer at step 90 is negative, the microprocessor determines whether the STABLEGAIN flag was set indicating gain adjustment has stabilized at step 92. If the answer at step 92 is negative, control is transferred to step 100. If the answer at step 92 is affirmative, the microprocessor determines whether the key's value is less than its running average by more than the minimum key press drop level at step 94. If the answer at step 94 is affirmative, the microprocessor identifies the key as being pressed by setting the KEYPRESS status flag and by storing the key's identity in a KEYID variable at step 96 with control then being transferred to step 102. If the answer at step 94 is negative, the microprocessor determines if the key's value is below the its average running value less noise AND whether the KEYDROP variable is low at step 98. If the answer at step 98 is negative control transfers to step 100. At step 100, the microprocessor filters in the key's value into its running average. If the answer at step 98 is affirmative, control is transferred to step 102. At step 102, the KEYLOOP counter is incremented and control is returned to step 90.

Figure 11A:
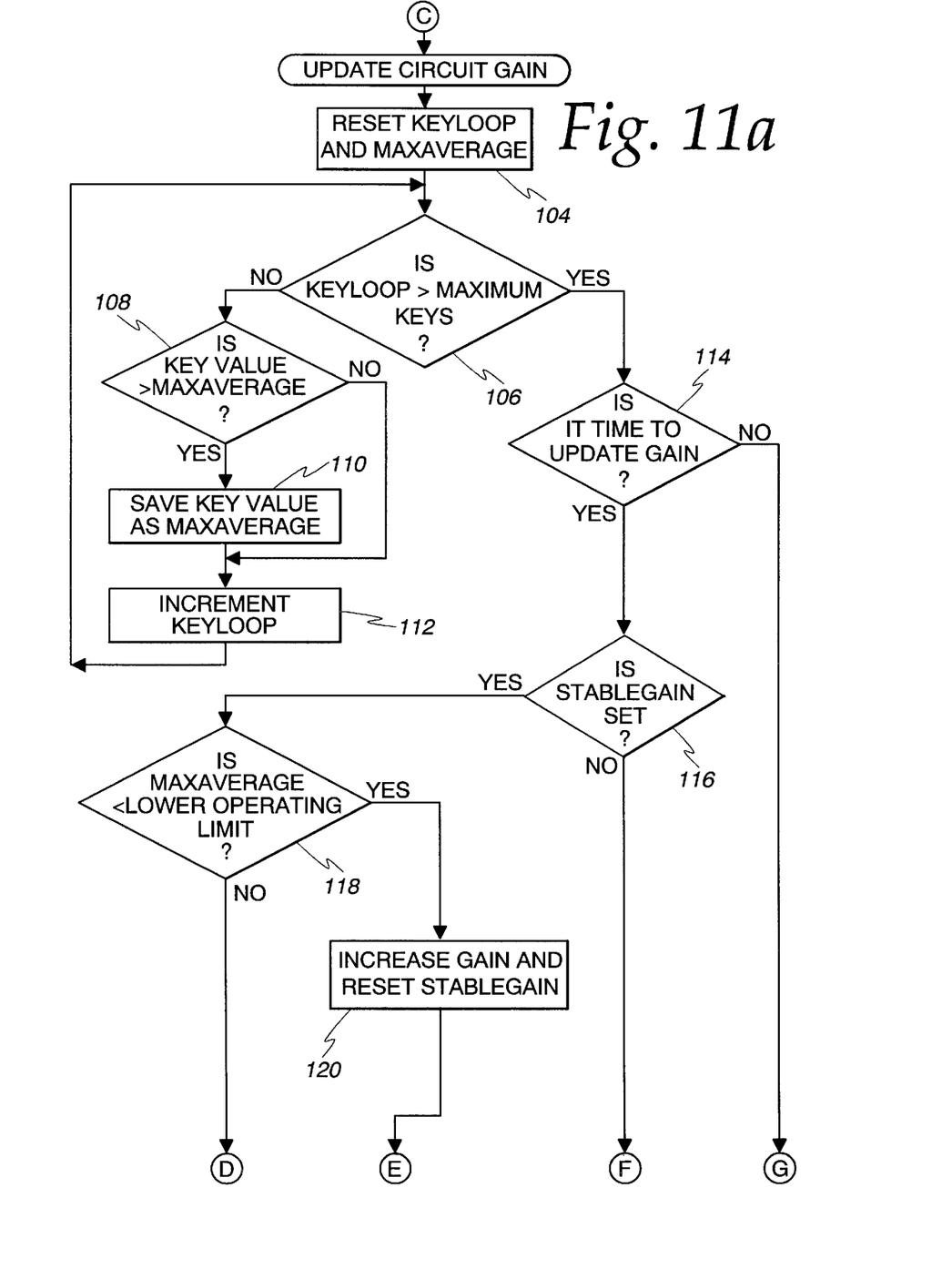
FIG. 11 is a flow chart of one embodiment of the update circuit gain functional block of the program of FIG. 7.
Figure 11B:
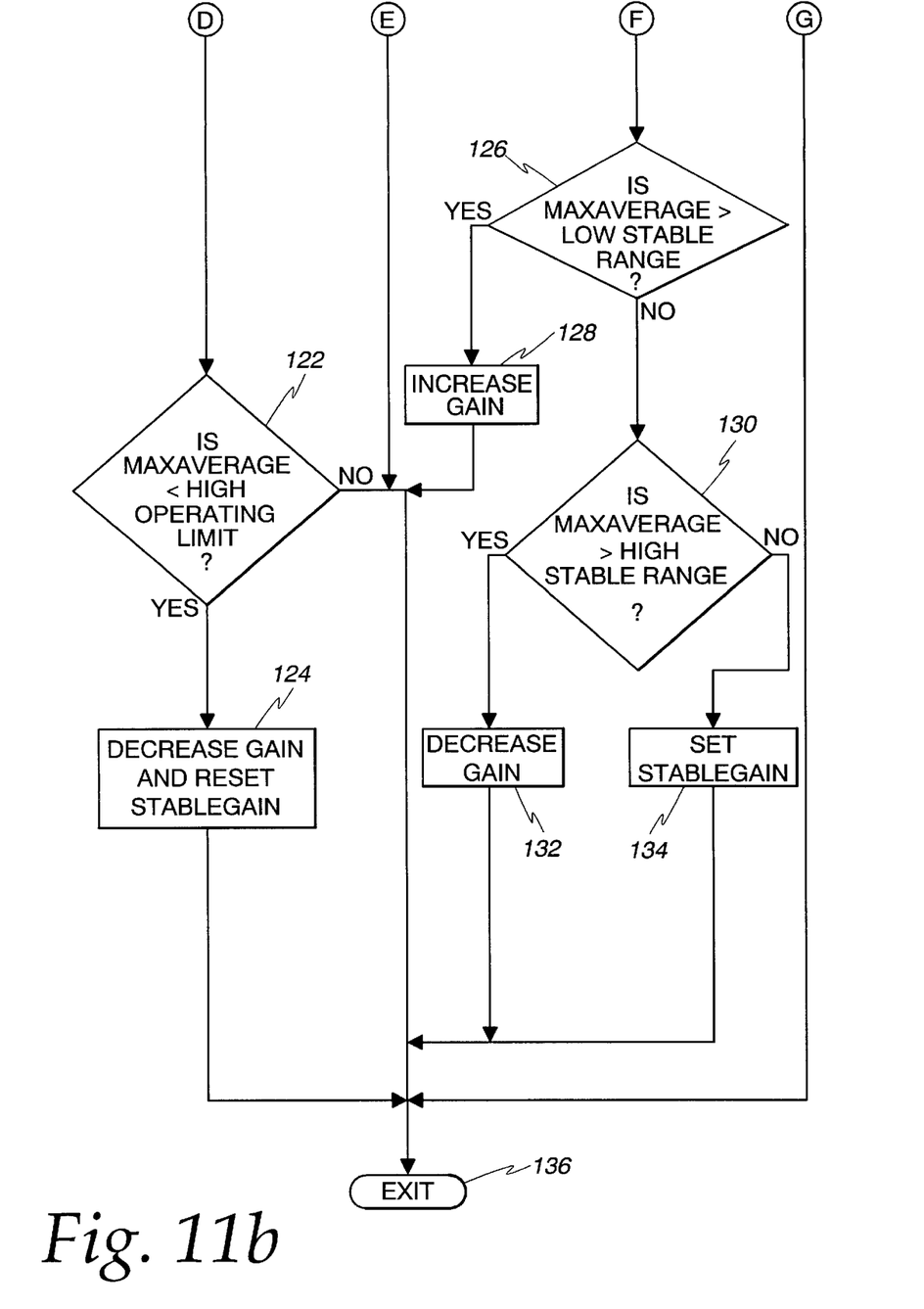

FIG. 11 illustrates the update circuit gain functional block 66. The program begins at step 104 by resetting the short-term variable KEYLOOP and resetting a MAXAVERAGE variable holding the highest running average of all the keys. At step 106, the microprocessor determines whether the KEYLOOP counter is greater than the number of keys on the keyboard. If the answer at step 106 is negative, the microprocessor determines whether the key's value is greater than the value stored in MAXAVERAGE at step 108. If the answer at step 108 is affirmative, the keys value is stored as the new MAXAVERAGE at step 110. If the answer at step 108 is negative, step 110 is bypassed and control is passed to step 112 where the KEYLOOP counter is incremented before returning to step 106. If the answer at step 106 is affirmative, the microprocessor determines whether it is time to check and update the circuit gain at step 114. The gain is checked and updated at set time intervals. If the answer to step 114 is negative, the microprocessor sends control to step 136. If the answer to step 114 is affirmative, the microprocessor, at step 116, determines whether the STABLEGAIN flag is set which indicates that the gain adjustment has stabilized.

If the answer at step 116 is affirmative, the microprocessor at step 118 determines whether the previous MAXAVERAGE is less than the low operating limit. If the answer at step 118 is affirmative, the GAIN variable representing the output gain setting is increased and the STABLEGAIN flag is reset at step 120 before sending control to step 136. If the answer at step 118 is negative, the microprocessor determines whether the MAXAVERAGE is greater than the high operating limit at step 122. If the answer to step 122 is affirmative, the microprocessor decreases the GAIN variable and resets the STABLEGAIN flag at step 124 before sending control to step 136. If the answer to step 122 is negative, the microprocessor sends control to step 136.

If the answer at step 116 is negative, the microprocessor determines whether the MAXAVERAGE is less than the low stable range at step 126. If the answer at step 126 is affirmative, the GAIN variable representing the output gain setting is increased at step 128 before sending control to step 136. If the answer at step 126 is negative, the microprocessor determines whether the MAXAVERAGE is greater than the high stable range at step 130. If the answer to step 130 is affirmative, the microprocessor decreases the GAIN variable at step 134 before sending control to step 136. If the answer at step 130 is negative, sets the STABLEGAIN flag indicating that the gain is stable before sending control to step 136. At step 136, the update circuit gain functional block 66 has been completed and the microprocessor restarts the with the read key signals functional block 60.

The non-contact key and keypad matrix of multiple non-contact keys can be manufactured following the membrane keyboard manufacturing method. Referring to FIG. 2, for creating a single switch or key the multiple layers may be built in any order. For constructing a keypad matrix, continuous sheets of materials may be used for the top layer 22, spacers 26 and ground plane 24 with individual transmitting elements and sensing elements arranged to correspond to key.

While particular embodiments and applications of the present invention have been illustrated and described, it is to be understood that the invention is not limited to the precise construction and compositions disclosed herein and that various modifications, changes, and variations will be apparent from the foregoing descriptions without departing from the spirit and scope of the invention as defined in the appended claims.

What is claimed is:

1. A non-contact switch capable of actuating from an off position state to an on position state when a lossy material enters a sensitive area of said switch, said non-contact switch comprising:

a transmitting element capable of radiating a signal, a portion of said signal less than the entire signal passing through said sensitive area of said switch; and a sensing element capable of receiving said signal, when said received signal is less than a predetermined level representing said lossy material entering said sensitive area, said non-contact switch actuating from said off position state to said on position state.

2. The non-contact switch of claim 1 further comprising a top layer separating said sensitive area from said sensing element and said transmitting element.

3. The non-contact switch of claim 1 wherein said transmitting element has an disk shape and said sensing element having an oval shape.

4. The non-contact switch of claim 1 wherein said transmitting element has a U-shape and said sensing element has a U-shape.

5. The non-contact switch of claim 1 wherein said transmitting element has a swirl shape and said sensing element has a swirl shape.

6. The non-contact switch of claim 1 wherein said transmitting element has a curved W-shape and said sensing element has a curved W-shape.

7. The non-contact switch of claim 1 wherein said transmitting element has a curved W-shape and said sensing element has a U-shape.

8. The non-contact switch of claim 1 wherein said transmitting element has three legs and said sensing element has three legs.

9. The non-contact switch of claim 1 wherein said transmitting element has an oval shape and said sensing element has a C-shape.

10. The non-contact switch of claim 1 further comprising a ground plane separating said transmitting element from said sensing element, said ground plane having an opening capable of passing said signal from said transmitting element to said sensing element, said signal not passing through said opening terminating on said ground plane.

11. The non-contact switch of claim 10 further comprising a first spacer separating said sensing element from said ground plane and a second spacer separating said ground plane from said transmitting element.

12. A non-contact switch capable of actuating from an off position to an on position when a lossy material enters a sensitive area of said switch, said non-contact switch comprising:

an oscillator for generating a signal;

a transmitting element connected to said oscillator for transmitting said signal, a portion of said signal less than the entire signal passing through said sensitive area of said switch;

a sensing element for receiving said signal transmitted from said transmitting element; and a sensing circuit for analyzing said signal received by said sensing element, when said sensing circuit determines said signal received is less than a predetermined level representing said lossy material entering said sensitive area, said sensing circuit actuating said non-contact switch to said on position.

13. The non-contact switch of claim 12 further comprising a top layer separating said sensitive area from said sensing element and said transmitting element.

14. The non-contact switch of claim 12 further comprising a ground plane separating said transmitting element from said sensing element, said ground plane having an opening capable of passing said signal from said transmitting element to said sensing element, said signal not passing through said opening terminating on said ground plane.

15. The non-contact switch of claim 14 further comprising a first spacer separating said sensing element from said ground plane and a second spacer separating said ground plane from said transmitting element.

16. A non-contact keypad capable of providing operator interface, said non-contact keypad comprising:

an oscillator for generating a signal;

at least one key adapted to switch from an off position to an on position when a lossy material enters a sensitive area of said key, each key comprising a transmitting element connected to said oscillator for transmitting said signal, a portion of said signal passing through a sensitive area of said key;

a sensing element for receiving said signal transmitted from said transmitting element; and a sensing circuit for analyzing the signal received by said sensing element of each key, when said sensing circuit determines said signal received is less than a predetermined level representing said lossy dielectric entering said sensitive area, said sensing circuit actuating said key to said on position.

17. The non-contact keypad of claim 16 wherein each key further comprising a top layer separating said sensitive area from said sensing element and said transmitting element.

18. The non-contact keypad of claim 16 wherein each key further comprising a ground plane separating said transmitting element from said sensing element, said ground plane having an opening to pass said signal from said transmitting element to said sensing element, said signal not passing through said opening terminating on said ground plane.

19. The non-contact keypad of claim 18 wherein each key further comprising a first spacer separating said sensing element from said ground plane and a second spacer separating said ground plane from said transmitting element.

20. A method of changing a switch from an off position to an on position when a lossy material enters a sensitive area of said switch, said method comprising the steps of:

radiating a signal from a transmitting element;

passing a portion of said signal less than the entire signal through said sensitive area of said switch;

receiving said signal in a sensing element;

monitoring said received signal in said sensing element; and changing said switch from said off position to said on position when said received signal is less than a predetermined level representing said lossy dielectric entering said sensitive area.

21. A non-contact keypad for a household appliance capable of providing operator interface, said non-contact keypad comprising:

an oscillator for generating a signal;

at least one key adapted to switch from an off position to an on position when a lossy material enters a sensitive area of said key, each key comprising a transmitting element connected to said oscillator for transmitting said signal, a portion of said signal passing through a sensitive area of said key;

a sensing element for receiving said signal transmitted from said transmitting element; and a sensing circuit for analyzing the signal received by said sensing element of each key, when said sensing circuit determines said signal received is less than a predetermined level representing said lossy dielectric entering said sensitive area, said sensing circuit actuating said key to said on position.

22. A non-contact switch capable of actuating from an off position to an on position when a lossy material enters a sensitive area of said switch, said non-contact switch comprising:

a transmitting element capable of radiating a signal, a portion of said signal comprising fringing flux passing through said sensitive area of said switch; and a sensing element capable of receiving said signal, when said received signal is less than a predetermined level representing said lossy material entering said sensitive area, said non-contact switch actuating from said off position to said on position.

23. A non-contact switch capable of actuating from an off position to an on position when a lossy material enters a sensitive area of said switch, said non-contact switch comprising:

a transmitting element capable of radiating a signal, a portion of said signal passing through said sensitive area of said switch; and a sensing element proximate said transmitting element, said sensitive area being located above said sensing element and said transmitting element, said sensing element capable of receiving said signal, when said received signal is less than a predetermined level representing said lossy material entering said sensitive area, said non-contact switch actuating from said off position to said on position.

24. A non-contact switch capable of actuating from an off position to an on position when a lossy material enters a sensitive area of said switch, said non-contact switch comprising:

a transmitting element capable of radiating a signal, a portion of said signal passing through said sensitive area of said switch;

a sensing element capable of receiving said signal, when said received signal is less than a predetermined level representing said lossy material entering said sensitive area, said non-contact switch actuating from said off position to said on position; and a ground plane separating said transmitting element from said sensing element, said ground plane having an opening capable of passing said signal from said transmitting element to said sensing element, said signal not passing through said opening terminating on said ground plane.

25. A non-contact switch capable of actuating from an off position state to an on position state when a lossy material enters a sensitive area of said switch, said non-contact switch comprising:

a transmitting element capable of radiating a signal, a portion of said signal passing through said sensitive area of said switch;

a sensing element capable of receiving said signal, when said received signal is less than a predetermined level representing said lossy material entering said sensitive area, said non-contact switch actuating from said off position state to said on position state; and a top layer separating said sensitive area from said sensing element and said transmitting element.

26. A non-contact switch capable of actuating from an off position state to an on position state when a lossy material enters a sensitive area of said switch, said non-contact switch comprising:

a transmitting element capable of radiating a signal, a portion of said signal passing through said sensitive area of said switch, said transmitting element having a disk shape; and a sensing element capable of receiving said signal, when said received signal is less than a predetermined level representing said lossy material entering said sensitive area, said non-contact switch actuating from said off position state to said on position state, said sensing element having an oval shape.

27. A non-contact keypad capable of providing operator interface, said non-contact keypad comprising:

an oscillator for generating a signal;

at least one key adapted to switch from an off position to an on position when a lossy material enters a sensitive area of said key, each key comprising a transmitting element connected to said oscillator for transmitting said signal, a portion of said signal passing through a sensitive area of said key;

a sensing element for receiving said signal transmitted from said transmitting element;

a ground plane separating said transmitting element from said sensing element, said ground plane having an opening to pass said signal from said transmitting element to said sensing element, said signal not passing through said opening terminating on said ground plane; and a sensing circuit for analyzing the signal received by said sensing element of each key, when said sensing circuit determines said signal received is less than a predetermined level representing said lossy dielectric entering said sensitive area, said sensing circuit actuating said key to said on position.

28. A method of changing a switch from an off position to an on position when a lossy material enters a sensitive area of said switch, said method comprising the steps of:

radiating a signal from a transmitting element;

passing a portion of said signal through an opening in a ground plane, said ground plane separating said transmitting element from a sensing element;

receiving said signal in said sensing element;

monitoring said received signal in said sensing element; and changing said switch from said off position to said on position when said received signal is less than a predetermined level representing said lossy dielectric entering said sensitive area.

* * * * *